US008719650B2

(12) United States Patent
Matsuo

(10) Patent No.: US 8,719,650 B2
(45) Date of Patent: May 6, 2014

(54) SELF-DIAGNOSIS SYSTEM AND TEST CIRCUIT DETERMINATION METHOD

(75) Inventor: Masafumi Matsuo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 253 days.

(21) Appl. No.: 13/086,852

(22) Filed: Apr. 14, 2011

(65) Prior Publication Data

US 2011/0264972 A1 Oct. 27, 2011

(30) Foreign Application Priority Data

Apr. 23, 2010 (JP) ................................. 2010-099582

(51) Int. Cl.
*G01R 31/28* (2006.01)

(52) U.S. Cl.
USPC ........................................................... 714/733

(58) Field of Classification Search
USPC ........................................................... 714/733
See application file for complete search history.

(56) References Cited

U.S. PATENT DOCUMENTS

| 7,836,371 | B2 * | 11/2010 | Dervisoglu et al. | 714/733 |
| 8,099,639 | B2 * | 1/2012 | Kodama | 714/718 |
| 2002/0024062 | A1 * | 2/2002 | Nakahara et al. | 257/200 |
| 2002/0060585 | A1 | 5/2002 | Doyle et al. | |
| 2007/0220389 | A1 * | 9/2007 | Sato | 714/733 |
| 2008/0062864 | A1 | 3/2008 | Harada | |

FOREIGN PATENT DOCUMENTS

| JP | 62188980 A | 8/1987 |
| JP | 2002267726 A | 9/2002 |
| JP | 2003-068865 A | 3/2003 |

OTHER PUBLICATIONS

Metra C., et al., "Compact and low power on-line self-testing voting scheme", Defect and fault tolerance in VLSI systems. 1997 Proceedings, 1997 IEEE International Symposium on Paris, France Oct. 20-22, 1997, Los Alamitos, CA, USA, IEEE Comput. Soc, US Oct. 20, 1997, pp. 137-145, XP010251256, DOI: 10.1109/DFTVS.1997. 628319, ISBN; 978-0-8186-8168-4.
Office Action issued by the Jaoanese Patent Office in corresponding Japanese Patent Application No. 2010-099582 dated Oct. 8, 2013.

* cited by examiner

*Primary Examiner* — Albert Decady
*Assistant Examiner* — Enam Ahmed
(74) *Attorney, Agent, or Firm* — Sughrue Mion, PLLC

(57) ABSTRACT

Provided are a self-diagnosis system and a test circuit determination method that are capable of determining normality of a test circuit which diagnoses a test target circuit. A self-diagnosis system according to an aspect of the present invention includes a test circuit including first and second diagnosis controllers which determine normality of a test target circuit by using an execution result of a test pattern in the test target circuit; and a test circuit determination unit which determines normality of the test circuit by comparing a normality determination result of the test target circuit output from the first diagnosis controller with a normal determination result of the test target circuit output from the second diagnosis controller.

16 Claims, 11 Drawing Sheets

SELF-DIAGNOSIS SYSTEM AND TEST CIRCUIT DETERMINATION METHOD

CROSS-REFERENCE TO RELATED APPLICATIONS

This application is based upon and claims the benefit of priority from Japanese patent application No. 2010-099582, filed on Apr. 23, 2010, the disclosure of which is incorporated herein in its entirety by reference.

BACKGROUND

The present invention relates to a self-diagnosis system and a test circuit determination method, and more particularly, to a self-diagnosis system including a test circuit having a redundant configuration, and a method for determining a test circuit having a redundant configuration.

In recent years, built-in self-test (BIST) circuits in which an LSI tester function for use in conducting a test for LSI (Large Scale Integration) is mounted in a chip have been actively developed. The use of BIST circuits leads to a reduction in time and cost of the LSI test as compared to the case where the LSI tester is mounted outside the chip.

Japanese Unexamined Patent Application Publication No. 2003-068865 discloses a configuration of a self-diagnosis device. The self-diagnosis device includes BIST circuits that perform self-diagnosis of semiconductor devices. The configuration of the self-diagnosis device disclosed in Japanese Unexamined Patent Application Publication No. 2003-068865 is described with reference to FIG. 11. The self-diagnosis device includes semiconductor devices 150 and 160, a main controller 400, a BIST controller 200, and a memory 300. Each of the semiconductor devices 150 and 160 includes a plurality of functional blocks and a plurality of BIST circuits. The main controller 400 controls the semiconductor devices 150 and 160. The BIST controller 200 controls the BIST circuits. The memory 300 stores a program for controlling the BIST controller 200.

The semiconductor devices 150 and 160 are semiconductor devices to be diagnosed. The semiconductor device 150 includes functional blocks 151 and 152 and BIST circuits 201 and 202. The BIST circuit 201 performs self-diagnosis of the functional block 151, and the BIST circuit 202 performs self-diagnosis of the functional block 152. The BIST circuits 201 and 202 are integrated in the semiconductor device 150 and are disposed in the vicinity of the functional blocks 151 and 152, respectively. Similarly, the semiconductor device 160 includes functional blocks 161 and 162 and BIST circuits 211 and 212. The BIST circuit 211 performs self-diagnosis of the functional block 161, and the BIST circuit 212 performs self-diagnosis of the functional block 162. The BIST circuits 201 and 202 are integrated in the semiconductor device 160 and are disposed in the vicinity of the functional blocks 161 and 162, respectively.

The BIST controller 200 is connected to the BIST circuits 201, 202, 211, and 212 through signal lines 301, 302, 311, and 312, respectively, and transmits diagnosis conditions corresponding to the functional blocks to the BIST circuits 201, 202, 211, and 212. Each of the BIST circuits transmits the diagnosis conditions received from the BIST controller 200 to the functional block to be diagnosed. Further, upon receiving a diagnosis result from the functional block, each of the BIST circuits transmits the diagnosis result to the BIST controller 200. The BIST controller 200 compares the diagnosis result received from each of the BIST circuit with a diagnosis expectation value received from the memory 300. The memory 300 is connected to the BIST controller 200 through a signal line 210, and stores the diagnosis conditions for the BIST circuits to diagnose each functional block, the diagnosis expectation value for each functional block, and the diagnosis results of each functional block.

The main controller 400 is connected to an external device (not shown), for example, a tester for a test, or a human interface device such as a key board. Further, the main controller 400 is connected to the BIST controller 200 through a signal line 220, and is connected to input/output terminals of the functional blocks through input/output signal lines 410, 420, 430, and 440, respectively. The main controller 400 performs processing, such as a typical numerical operation or image processing, by using the functional blocks based on an instruction from an external human interface device. Meanwhile, the main controller 400 can also perform diagnosis of each functional block based on a diagnosis pattern received from an external tester. Furthermore, the main controller 400 can transmit self-diagnosis results of the functional blocks of the semiconductor devices, which are obtained by the BIST controller 200, to the external tester or the like.

SUMMARY

In the field of improvement in the reliability of self-diagnosis, it is mandatory in Europe to acquire functional safety certification at ECU level so that the government checks the compliance with standards for vehicles and the like. Under such circumstances, there is an increasing need for diagnosis of functional blocks to be diagnosed, as well as for countermeasures to improve the reliability of a test circuit for performing diagnosis control.

The self-diagnosis device disclosed in Japanese Unexamined Patent Application Publication No. 2003-068865 performs diagnosis of the functional blocks to be diagnosed in the self-diagnosis. However, the reliability of the test circuit for performing diagnosis control is not secured. In other words, if a malfunction occurs due to noise during the self-diagnosis operation, or a failure occurs in the test circuit, self-diagnosis results may be erroneously determined as correct results even when the functional blocks are not correctly diagnosed.

A first aspect of the present invention is a self-diagnosis system including: a test circuit including first and second diagnosis controllers which determine normality of a test target circuit by using an execution result of a test pattern in the test target circuit; and a test circuit determination unit which determines normality of the test circuit by comparing a normality determination result of the test target circuit output from the first diagnosis controller with a normal determination result of the test target circuit output from the second diagnosis controller.

The use of the self-diagnosis system enables acquisition of the normality determination results of the test target circuit output from the diagnosis controllers which are redundantly configured in the test circuit. Consequently, the normality of the test circuit can be determined by comparing the normality determination results output from the diagnosis controllers.

A second aspect of the present invention is a test circuit determination method including: determining normality of a test target circuit in first and second diagnosis controllers included in a test circuit, by using an execution result of a test pattern in the test target circuit; and determining normality of the test circuit by comparing a normality determination result of the test target circuit output from the first diagnosis controller, with a normality determination result of the test target circuit output from the second diagnosis controller.

The use of the test circuit determination method enables acquisition of the normality determination results of the test target circuit output from the diagnosis controllers which are redundantly configured in the test circuit. Consequently, the normality of the test circuit can be determined by comparing the normality determination results output from the diagnosis controllers.

According to an exemplary aspect of the present invention, it is possible to provide a self-diagnosis system and a test circuit determination method that are capable of determining normality of a test circuit that performs diagnosis of a test target circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
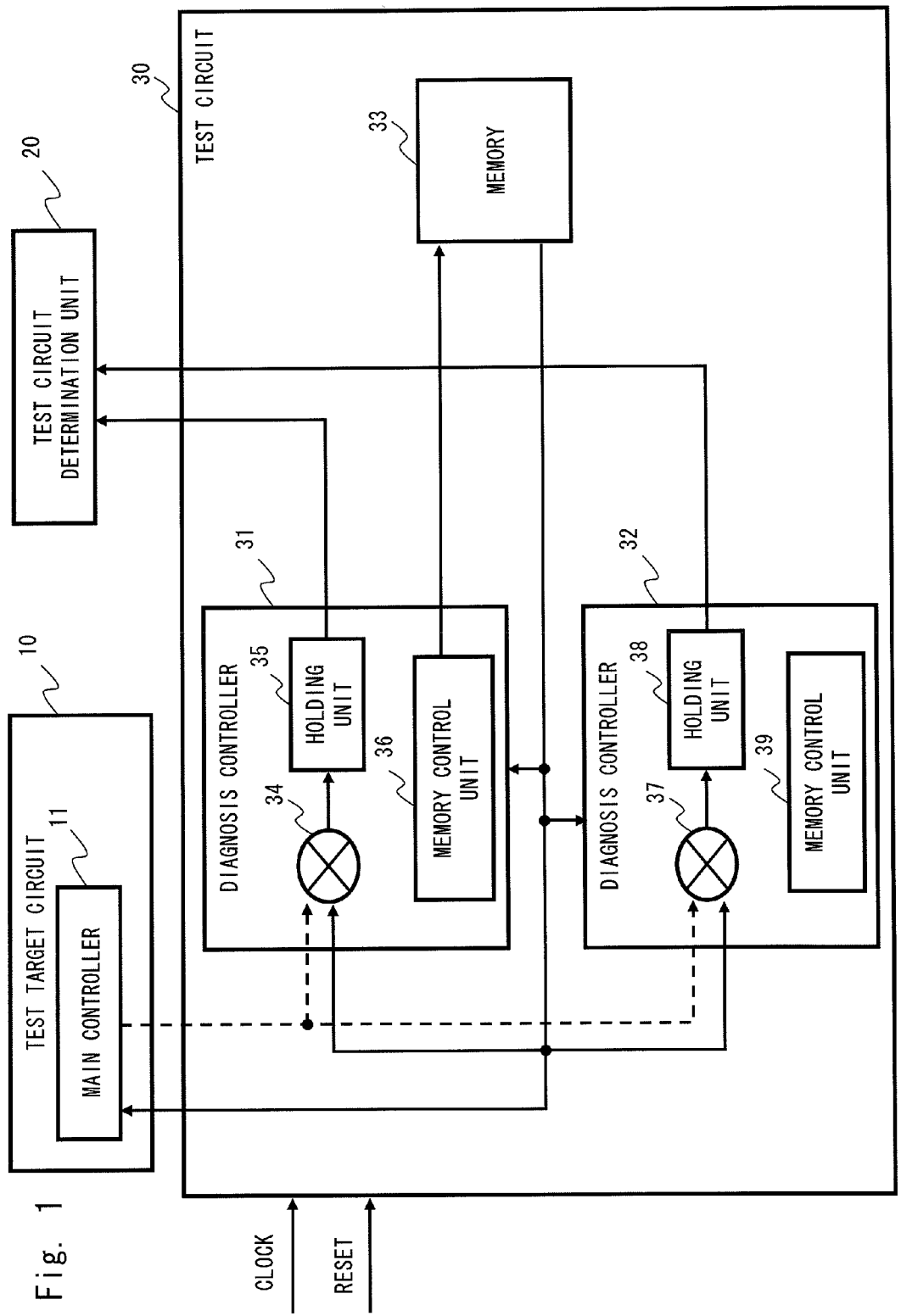
FIG. 1 is a block diagram showing a self-diagnosis system according to a first embodiment of the present invention.

Embodiments of the present invention will now be described with reference to the accompanying drawings. An exemplary configuration of a self-diagnosis system according to a first embodiment of the present invention is described with reference to FIG. 1. The self-diagnosis system includes a test target circuit 10, a test circuit determination unit 20, and a test circuit 30.

First, an exemplary configuration of the test target circuit 10 will be described. The test target circuit 10 includes a main controller 11. The main controller 11 executes a test pattern obtained from the test circuit 30. Further, the main controller 11 outputs an execution result of the test pattern to the test circuit 30. The test target circuit 10 is a functional block that executes numerical operations, image processing, or the like.

Next, an exemplary configuration of the test circuit 30 will be described. The test circuit 30 includes diagnosis controllers 31 and 32 and a memory 33. The diagnosis controller 31 includes a comparison unit 34, a holding unit 35, and a memory control unit 36. Similarly, the diagnosis controller 32 includes a comparison unit 37, a holding unit 38, and a memory control unit 39. The test circuit 30 operates in response to an input clock. When a reset signal is set to an inactive level, the diagnosis controllers 31 and 32 are activated.

The memory control unit 36 outputs a memory control signal to the memory 33 to read data stored in the memory 33. Upon acquiring the memory control signal, the memory 33 outputs the stored data to the diagnosis controllers 31 and 32 and the main controller 11. The data output from the memory 33 includes a test pattern to be executed in the test target circuit 10, a diagnosis expectation value, and a diagnosis control signal.

The test pattern is input to the main controller 11. The main controller 11 executes the acquired test pattern and checks the normality of the test target circuit 10. The diagnosis expectation value is input to each of the comparison units 34 and 37. The diagnosis expectation value is output when the operation is normally performed upon execution of the test pattern. Each of the comparison units 34 and 37 acquires the execution result of the test pattern from the main controller 11. The comparison unit 34 compares the diagnosis expectation value with the execution result of the test pattern. The comparison unit 34 outputs the comparison result to the holding unit 35. Similarly, the comparison unit 37 compares the diagnosis expectation value with the execution result of the test pattern and outputs the comparison result to the holding unit 38.

The diagnosis control signal is a signal for use in controlling the operation of the diagnosis controllers 31 and 32. For example, upon acquiring the diagnosis control signal, the diagnosis controllers 31 and 32 cause the comparison units 34 and 37 to start or finish the comparison process between the diagnosis expectation value and the execution result of the test pattern. Thus, the comparison operation timing in each of the comparison units 34 and 37 can be controlled using the diagnosis control signal. Further, during the execution of the test pattern in the test target circuit 10, access from the memory control unit 36 or 39 to the memory 33 can be controlled to be prohibited by using the diagnosis control signal.

Each of the holding units 35 and 38 holds the acquired comparison result, and outputs the comparison result as a determination signal to the test circuit determination unit 20. As the comparison result output from the comparison units 34 and 37, a PASS signal is output when the diagnosis expectation value matches the execution result of the test pattern, and a FAIL signal is output when the diagnosis expectation value does not match the execution result of the test pattern. The PASS signal indicates that the test target circuit 10 is operating normally, and the FAIL signal indicates that the test target circuit 10 is not operating normally, or indicates that a failure or the like is occurring in the test target circuit 10.

The test circuit determination unit 20 acquires the determination signals, in which the PASS signal or the FAIL signal is set, from the holding units 35 and 38. Upon acquiring the PASS signal from each of the holding units 35 and 38, the test circuit determination unit 20 determines that both the test target circuit 10 and the test circuit 30 are normal. Upon acquiring the FAIL signal from each of the holding units 35 and 38, the test circuit determination unit 20 determines that the test target circuit 10 is abnormal and the test circuit 30 is normal. Upon acquiring different determination results from the holding units 35 and 38, specifically, upon acquiring the PASS signal from the holding unit 35 (or the holding unit 38) and the FAIL signal from the holding unit 38 (or the holding unit 35), the test circuit determination unit 20 determines that the test circuit 30 is abnormal. At this time, since the test circuit determination unit 20 determines that the test circuit 30 is abnormal, the test circuit determination unit 20 cannot determine the normality of the test target circuit 10. In such a case, the test circuit determination unit 20 may determine that the test target circuit 10 is also abnormal. The test circuit determination unit 20 outputs the normality determination results of the test target circuit 10 and the test circuit 30 to an external device or the like.

Figure 2:
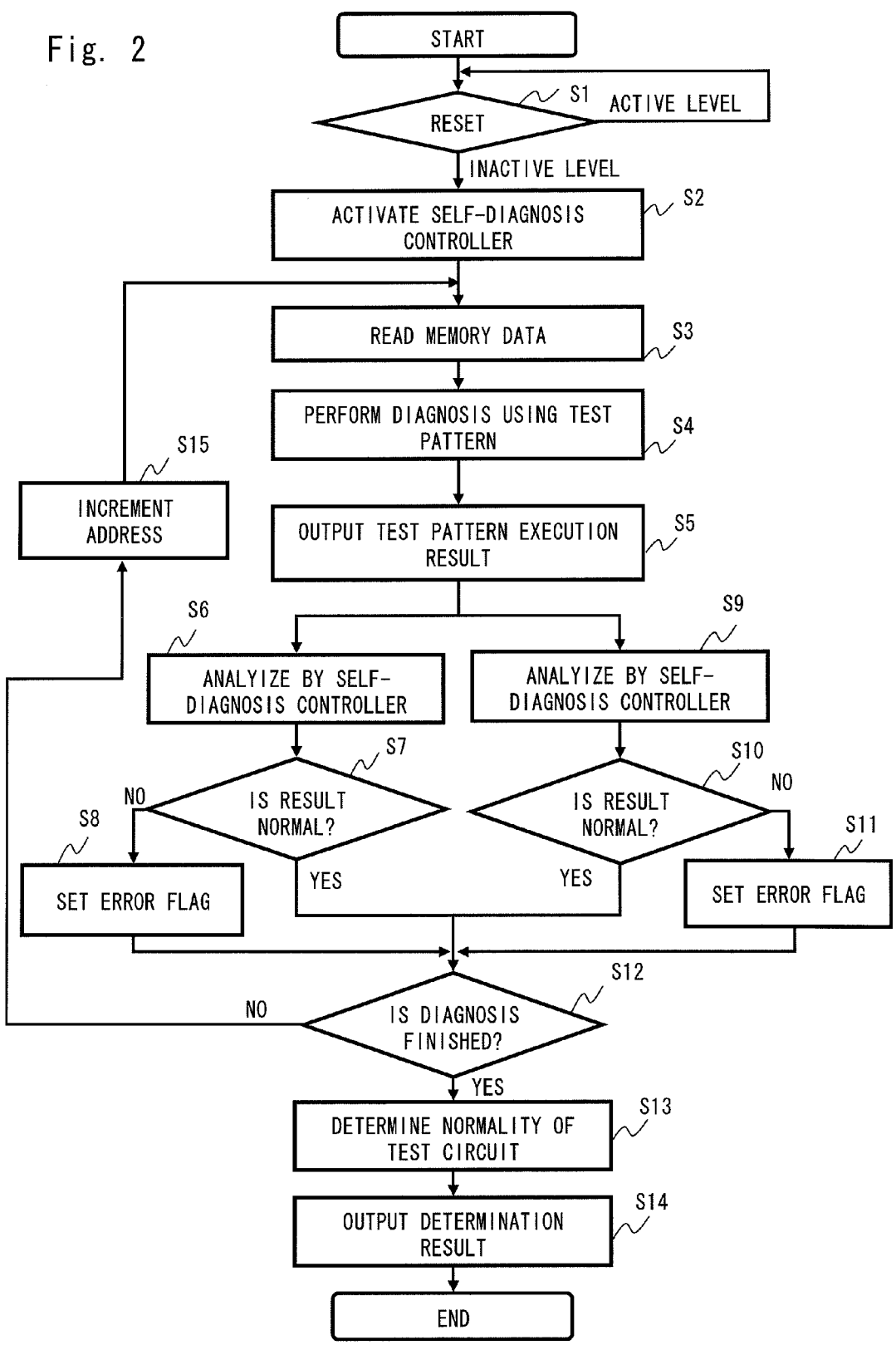
FIG. 2 is a flowchart showing processes for determining the normality of a test circuit according to the first embodiment.

Referring next to FIG. 2, a flow of processes for determining the normality of the test target circuit 10 and the test circuit 30 according to the first embodiment of the present invention will be described.

First, the test circuit 30 determines whether the acquired reset signal is set to an active level or an inactive level (S1). In this case, a determination as to the level of the reset signal is made by a control unit (not shown) included in the test circuit 30, for example. When the test circuit 30 determines that the reset signal is set to the active level, the process of step S1 is repeated. When the test circuit 30 determines that the reset signal is set to the inactive level, the diagnosis controllers 31 and 32 are activated (S2).

Next, the memory control unit 36 outputs the memory control signal to the memory 33. Alternatively, the memory control unit 39 may output the memory control signal to the memory 33. Accordingly, the data held in the memory 33 is read out and output to the diagnosis controllers 31 and 32 and the test target circuit 10 (S3).

Next, the main controller 11 acquires a test pattern from the memory 33, and diagnoses the test target circuit 10 by using the test pattern (S4). Then, the main controller 11 outputs the execution result of the test pattern to the test circuit 30 (S5).

Next, the comparison unit 34 determines the normality of the test target circuit 10 by using the execution result acquired from the main controller 11 and the diagnosis expectation value acquired from the memory 33 (S6). When the execution result matches the diagnosis expectation value, the comparison unit 34 outputs the PASS signal to the holding unit 35. The PASS signal indicates that the test target circuit 10 is normal. When the execution result does not match the diagnosis expectation value, the comparison unit 34 sets an error flag, or outputs the FAIL signal to the holding unit 38 (S8). The FAIL signal indicates that the test target circuit 10 is abnormal, or indicates that a failure is occurring. Also the comparison unit 37 executes processes similar to those of the comparison unit 34 (S9 to S11).

Next, the diagnosis controller 31 or 32 determines whether a diagnosis end address is set to the data read out from the memory (S12). When the diagnosis end address is not set, the address is incremented (S15) and the processes after step S3 are repeated. When the diagnosis end address is set, the diagnosis of the test target circuit 10 is finished.

After the diagnosis of the test target circuit 10 is finished, the test circuit determination unit 20 determines the normality of the test target circuit 10 and the test circuit 30. As described above, the test circuit determination unit 20 determines the normality of each of the test target circuit 10 and the test circuit 30 based on the diagnosis results of the test target circuit 10 output from the diagnosis controllers 31 and 32. Then, the test circuit determination unit 20 outputs normality determination results of the test target circuit 10 and the test circuit 30 to an external device or the like, for example (S14).

As described above, the use of the self-diagnosis system according to the first embodiment of the present invention enables determination of not only the normality of the test target circuit 10, but also the normality of the test circuit 30. Consequently, the reliability of the normality determination result of the test target circuit 10 in the test circuit 30 can be improved.

Second Embodiment

Figure 3:
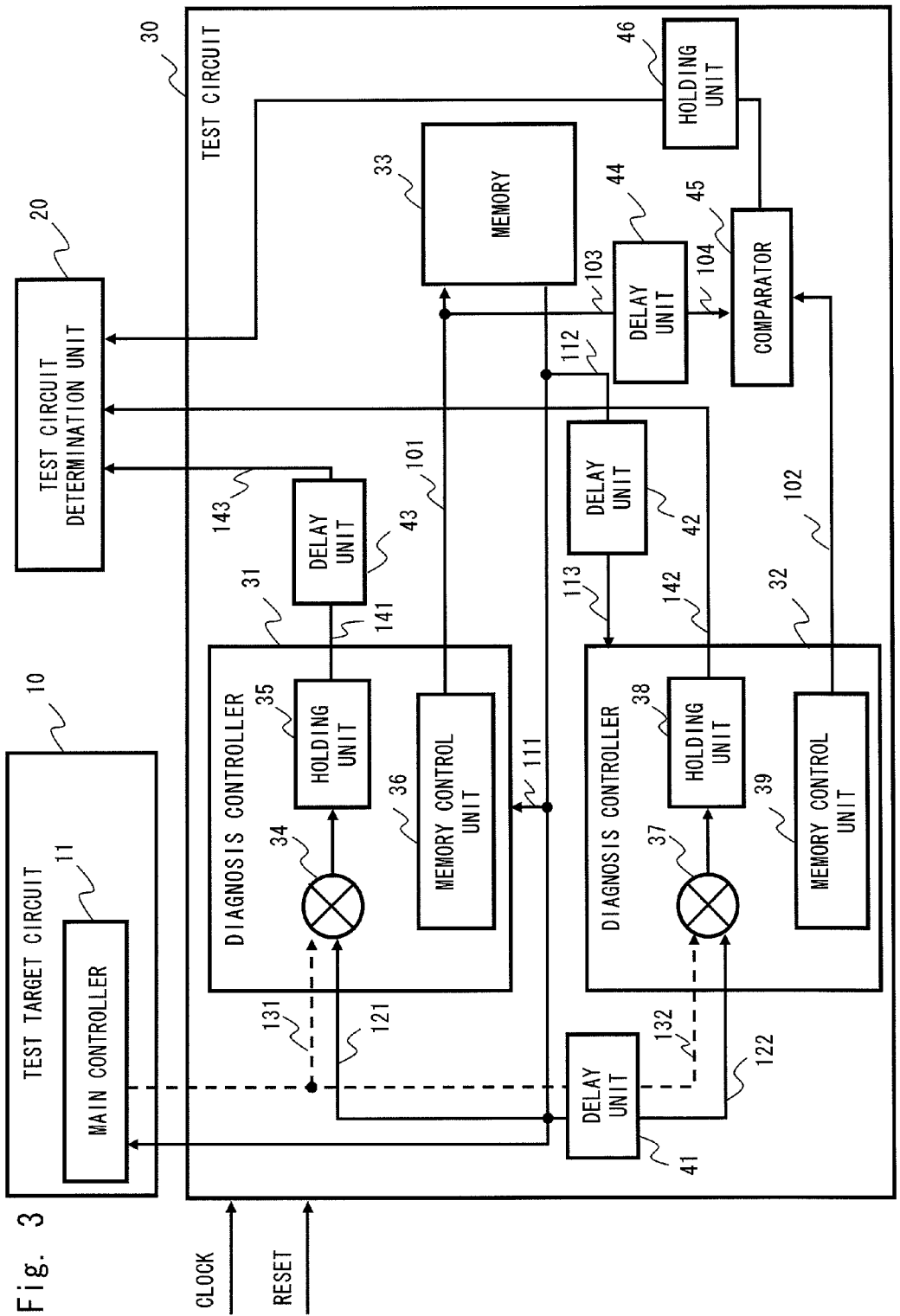
FIG. 3 is a block diagram showing a self-diagnosis system according to a second embodiment of the present invention.

Referring now to FIG. 3, a self-diagnosis system according to a second embodiment of the present invention will be described. The self-diagnosis system shown in FIG. 3 includes delay units 41 to 44, a comparator 45, and a holding unit 46, in addition to the components of the self-diagnosis system shown in FIG. 1. The other configuration is similar to that shown in FIG. 1, so the following description will be made using the same reference numerals used in FIG. 1.

The delay units 41 to 44 output received signals with a delay of one clock.

The delay unit 41 is connected between the memory 33 and the comparison unit 37. The delay unit 41 is also connected between the main controller 11 and the comparison unit 37. The delay unit 41 delays the output timing of the diagnosis expectation value output from the memory 33 to the comparison unit 37. Accordingly, the comparison unit 37 acquires a diagnosis expectation value 122 output from the delay unit 41 with a delay from the timing of a diagnosis expectation value 121 which is acquired by the comparison unit 34. Further, the delay unit 41 delays the output timing of the execution result output from the main controller 11 to the comparison unit 37. As a result, the comparison unit 37 acquires an execution result 132, which is output from the delay unit 41, with a delay from the timing at which the comparison unit 34 acquires an execution result 131. This prevents the diagnosis expectation value and the execution result, which are redundantly output to the diagnosis controllers 31 and 32, from malfunctioning simultaneously due to the effect of noise or the like.

The delay unit 42 delays the output timing of a diagnosis control signal 112 which is output from the memory 33 to the diagnosis controller 32. Accordingly, the diagnosis controller 32 acquires a diagnosis control signal 113, which is output from the delay unit 42, with a delay from the timing at which the diagnosis controller 31 acquires a diagnosis control signal 111. This allows the diagnosis controllers 31 and 32 to operate at different timings. For example, the diagnosis controller 32 operates with a delay of one clock from the diagnosis controller 31. The diagnosis controllers 31 and 32 are allowed to operate at different timings, thereby preventing the diagnosis controllers 31 and 32 from malfunctioning simultaneously due to the effect of noise or the like.

The delay unit 43 is connected between the holding unit 35 and the test circuit determination unit 20. The delay unit 43 delays the output timing of a determination signal 141 which is output from the holding unit 35 to the test circuit determination unit 20. Delaying the output timing of the determination signal 141 makes it possible to match the output timing of a determination signal 142, which is output from the diagnosis controller 32 that operates with a delay by the control of the diagnosis control signal 113 to the test circuit determination unit 20, with the output timing of a determination signal 143 output from the delay unit 43. This allows the test circuit determination unit 20 to determine the normality of the test target circuit 10 and the test circuit 30 by using the determination signal 142 and the determination signal 143 which are acquired at the same timing from the diagnosis controllers 31 and 32.

The delay unit 44 delays the memory control signal output from the memory control unit 36, and outputs the delayed memory control signal to the comparator 45. Specifically, an address containing data read out from the memory 33 is set in the memory control signal. Hereinafter, the memory control signal, which is output from the memory control units 36 and 39 to the memory 33, is referred to as an address signal.

Unlike the first embodiment, in the second embodiment of the present invention, when the reset signal is set to the inactive level, the diagnosis controller 31 is activated, and the diagnosis controller 32 is activated with a delay from the diagnosis controller 31. The diagnosis controllers 31 and 32 are activated and the memory control units 36 and 39 output address signals to the memory 33. In short, the address signal output from the memory control unit 39 is output with a delay from the address signal output from the memory control unit 36. The address signals are output from the memory control units 36 and 39 so as to determine the normality of the address signals output to the memory 33. The comparator 45 compares the address signals output from the memory control units 36 and 39. When the address signals match, the comparator 45 determines the address signals as normal and outputs the PASS signal to the test circuit determination unit 20 through the holding unit 46. Meanwhile, when the address signals output from the memory control units 36 and 39 do not mach, the comparator 45 determines the address signals as abnormal and outputs the FAIL signal to the test circuit determination unit 20 through the holding unit 46. At this time, the diagnosis controller 32 is activated with a delay from the diagnosis controller 31. Accordingly, an address signal 103 output from the diagnosis controller 31 is delayed by the delay unit 44, and an address signal 104 is output from the delay unit 44. This allows the comparator 45 to acquire the address signal 104, which is output from the memory control unit 36, and an address signal 102, which is output from the memory control unit 39, at the same timing.

As a result, the comparator 45 can determine the normality of the address signals by using the address signals 102 and 104 which are acquired at the same timing.

Alternatively, a plurality of comparators 45 may be arranged in parallel with each other and each of the comparators 45 may determine the normality of the address signals. In this case, determination results from the comparators 45 may be collected, and any of the determination results may be selected and output to the test circuit determination unit 20.

Figure 4:
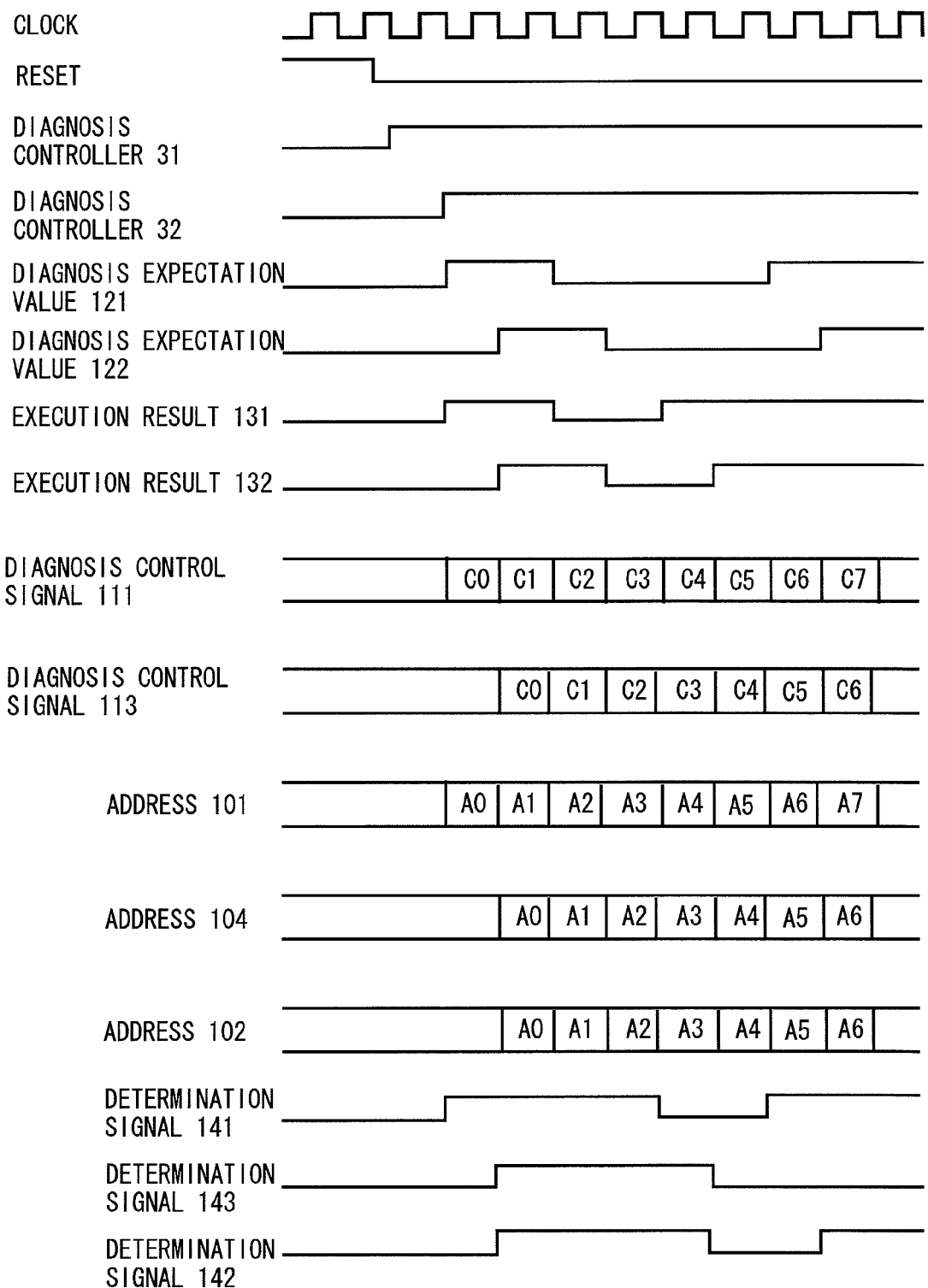
FIG. 4 is a diagram showing timings of signals in a test circuit according to the second embodiment.

Referring next to FIG. 4, the output timings of the signals according to the second embodiment of the present invention will be described. The test circuit 30 operates based on the acquired clock. The clock is supplied from a clock generator (not shown) or the like. The reset signal is output from a control unit (not shown) or the like of a device including a self-diagnosis system. When the reset signal is set to the inactive level (low level), the diagnosis controller 31 is first activated and the diagnosis controller 32 is activated with a delay of one clock.

The diagnosis expectation value 122 is output from the delay unit 41, and thus the diagnosis expectation value 122 is output with a delay of one clock from the diagnosis expectation value 121. Similarly, the execution result 132 is output from the delay unit 41, and thus the execution result 132 is output with a delay of one clock from the execution result 131.

The diagnosis control signal 113 is output from the delay unit 42, and thus the diagnosis control signal 113 is output with a delay of one clock from the diagnosis control signal 111. Accordingly, the diagnosis controller 32 operates with a delay of one clock from the diagnosis controller 31.

Since the diagnosis controller 32 is activated with a delay of one clock from the diagnosis controller 31, the address signal 102 is output with a delay of one clock from the address signal 101. Further, since the address signal 104 is output from the delay unit 44, the address signal 104 is output with a delay of one clock from the address signal 101. Accordingly, the output timing of the address signal 104 matches the output timing of the address signal 102. In other words, the delay units 42 and 44 have the same amount of delay, with the result that the delay is cancelled out when the comparator 45 acquires the address signals 104 and 102.

The determination signal 142 is output with a delay of one clock from the determination signal 141. This is because the diagnosis expectation value 122 and the diagnosis execution result 132 are input to the comparison unit 37 with a delay of one clock from the timing at which the diagnosis expectation value 121 and the execution result 131 are input to the comparison unit 34. In this case, the determination signal 143, which is output from the delay unit 43, is output with a delay of one clock from the determination signal 141. Accordingly, the output timing of the determination signal 143 matches the output timing of the determination signal 142. In other words, the delay unit 41 and the delay unit 43 have the same amount of delay, with the result that the delay is cancelled out when the test circuit determination unit 20 acquires the determination signals 142 and 143. The test circuit determination unit 20 determines the normality of the test circuit 30 based on the determination signals 142 and 143 which are output at the same timing.

As described above, the use of the delay unit 41 of the self-diagnosis system according to the second embodiment of the present invention allows redundant signals to be output at different timings from the memory 33 and the main controller 11. This prevents the redundant signals from malfunctioning simultaneously due to the effect of noise or the like. Further, the use of the delay unit 42 enables the redundant diagnosis controllers 31 and 32 to operate at different timings, thereby preventing the diagnosis controllers 31 and 32 from malfunctioning simultaneously due to the effect of noise or the like.

Furthermore, the use of the delay units 43 and 44 enables normality determination of the test circuit 30 by using the signals acquired at the same timing in the test circuit determination unit 20 and the comparator 45.

Third Embodiment

Figure 5:
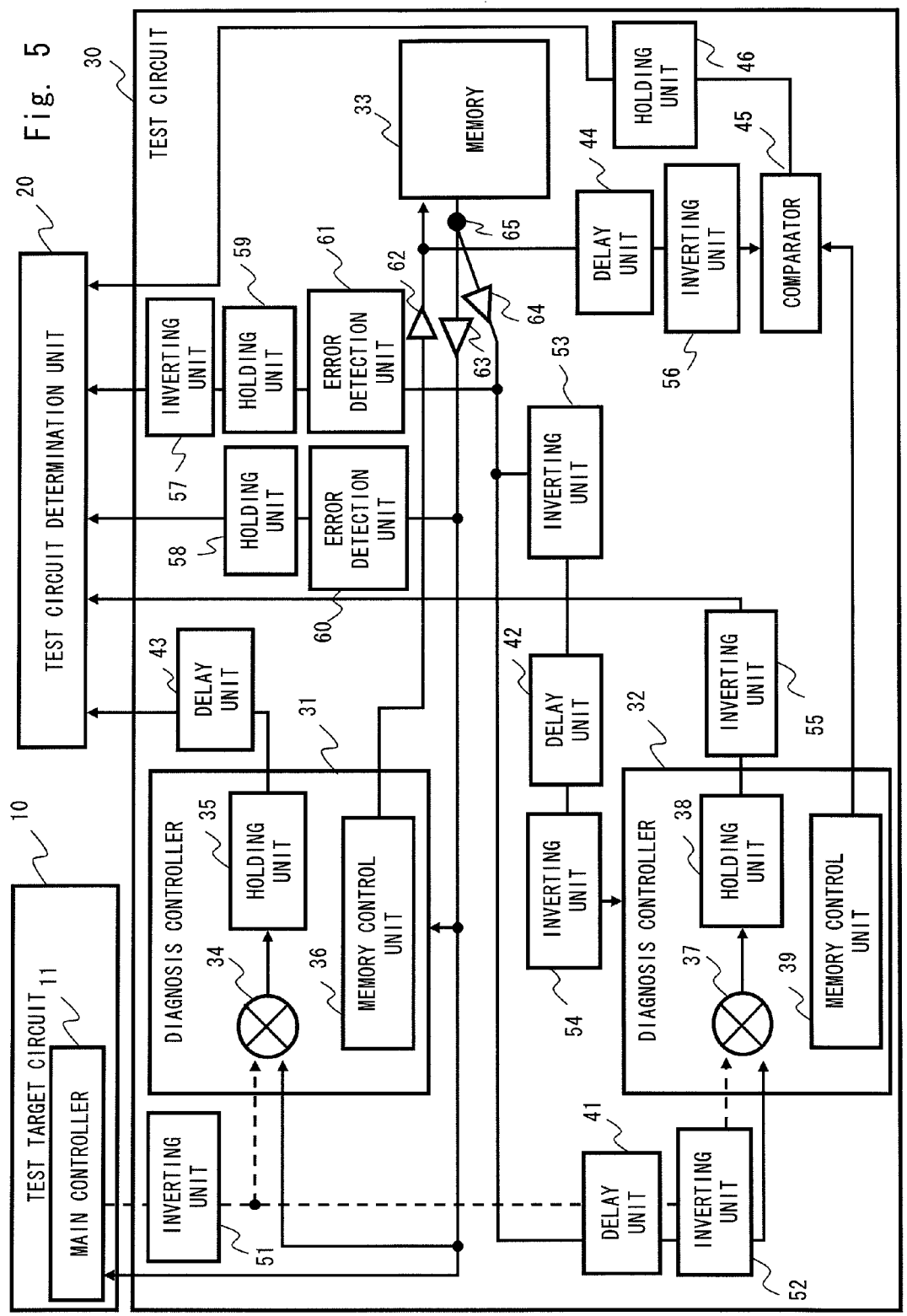
FIG. 5 is a block diagram showing a self-diagnosis system according to a third embodiment of the present invention.

Referring now to FIG. 5, an exemplary configuration of a self-diagnosis system according to a third embodiment of the present invention will be described. The self-diagnosis system shown in FIG. 5 includes inversion units 51 to 57, holding units 58 and 59, error detection units 60 and 61, buffers 62 to 64, a branch unit 65, in addition to the components of the self-diagnosis system shown in FIG. 3. The other configuration is similar to that shown in FIG. 3, so the following description will be made using the same reference numerals used in FIG. 3.

The inversion unit 51 is connected to each of the main controller 11, the delay unit 41, and the comparison unit 34. The inversion unit 51 inverts the value of the execution result output from the main controller 11. The inversion unit 51 outputs a signal indicating the inverted execution result to each of the comparison unit 34 and the delay unit 41. The inversion unit 52 inverts the value of the execution result output from the delay unit 41, and outputs the inverted value to the comparison unit 37. Further, the inversion unit 52 inverts the diagnosis expectation value output from the delay unit 41 and outputs the inverted diagnosis expectation value to the comparison unit 37. Accordingly, the comparison unit 34 compares the inverted execution result with the diagnosis expectation value output from the memory 33. In this case, the comparison unit 34 outputs the PASS signal when the execution result is different from the diagnosis expectation value, and outputs the FAIL signal when the execution result matches the diagnosis expectation value. Similarly, the comparison unit 37 compares the diagnosis execution result, which is inverted twice and restored to the value output from the main controller 11, with the inverted diagnosis expectation value.

The inversion unit 55 inverts the determination signal output from the holding unit 38, and outputs the inverted determination signal to the test circuit determination unit 20.

A determination process of the test circuit determination unit 20 will now be described in detail. For example, when a high-level signal is set to the determination signal output from the diagnosis controller 31, a PASS determination is made, and when a low-level signal is set to the determination signal, a FAIL determination is made. The determination signal output from the diagnosis controller 32 is inverted by the inversion unit 55. Accordingly, when a high-level signal is set to the determination signal output from the diagnosis controller 32, a FAIL determination is made, and when a low-level signal is set to the determination signal, a PASS determination is made.

When both the outputs from the diagnosis controllers 31 and 32 are determined as PASS, the test circuit determination unit 20 determines that the test target circuit 10 and the test circuit 30 are normal. When both the outputs from the diagnosis controllers 31 and 32 are determined as FAIL, the test circuit determination unit 20 determines that the test target circuit 10 is abnormal and the test circuit 30 is normal. When one of the outputs from the diagnosis controllers 31 and 32 is determined as FAIL, the test circuit determination unit 20 determines that the test circuit 30 is abnormal.

The inversion unit 56 inverts the memory control signal (address signal) output from the memory control unit 36 through the delay unit 44, and outputs the inverted memory control signal to the comparator 45. Accordingly, when the memory control signal output from the memory control unit 36 is different from the memory control signal output from the memory control unit 39, the comparator 45 determines that the memory control signals are normal. When the memory control signals match, the comparator 45 determines that the memory control signals are abnormal. When the comparison result signal output from the comparator 45 indicates that the memory control signals are abnormal, the test circuit determination unit 20 determines that the test circuit 30 is abnormal.

The use of the inversion units 51, 52, 55, and 56 as described above can improve the resistance to noise. The reason for this will be described below with reference to FIGS. 6 and 7.

Figure 6:
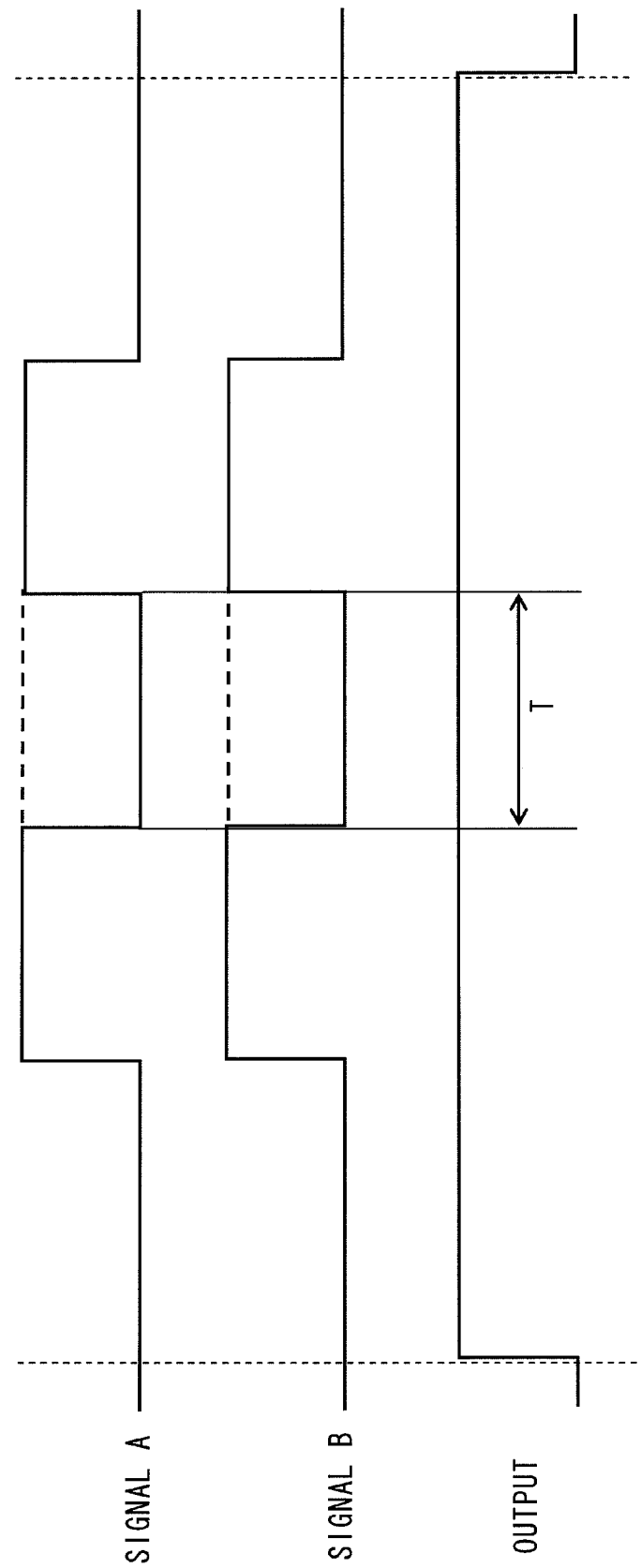
FIG. 6 is a diagram showing output results when an inversion unit according to the third embodiment is not provided.

FIG. 6 shows an example of a non-inversion comparison in which signals are not inverted. During a period T, when the voltage level increases due to noise and the low-level signal is determined as the high-level signal (as indicated by the dashed line in the period T), both signals A and B are determined as the high-level signals. Accordingly, when noise is superimposed on the signals, both the signals A and B match each other at a high level during the period T. Therefore, the comparison result between the signals A and B is determined as normal.

Figure 7:
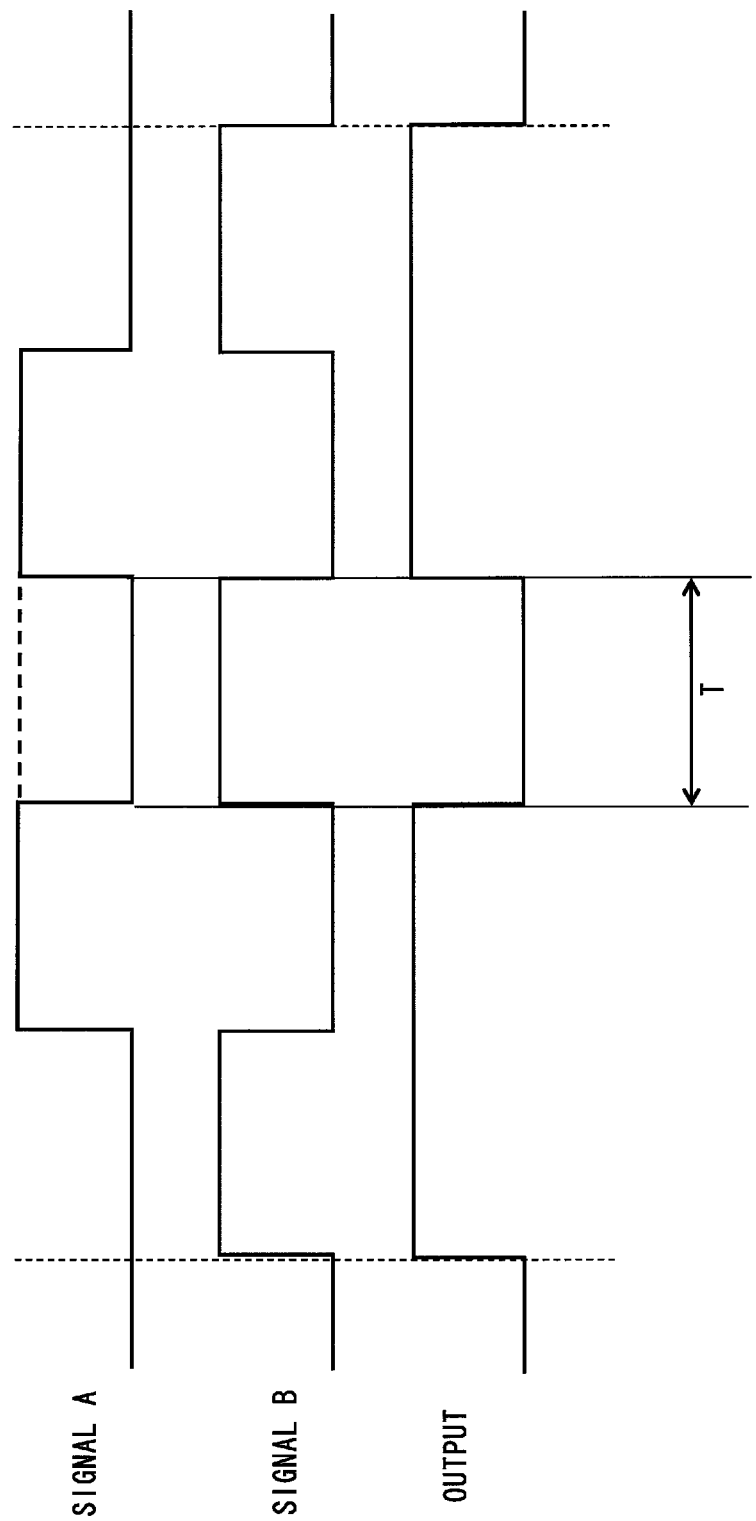
FIG. 7 is a diagram showing output results when the inversion unit according to the third embodiment is provided.

Meanwhile, FIG. 7 shows an example of an inversion comparison in which the signal B is inverted. During the period T, when the voltage level increases due to the effect of noise and the low-level signal is determined as the high-level signal (as indicated by the dashed line in the period T), the signals A and B match at the high level during the period T. Accordingly, the comparison result between the signals A and B is determined as abnormal. Thus, during the period T, when the signal A is inverted to the high-level signal due to noise, the error can be detected. Therefore, the use of the inversion units can improve the resistance to noise.

Returning to FIG. 5, an exemplary configuration of the self-diagnosis system according to the third embodiment of the present invention will be described. The diagnosis expectation value and diagnosis control signal, which are output from the memory 33 to the diagnosis controller 31, and the diagnosis expectation value and diagnosis control signal, which are output from the memory 33 to the diagnosis controller 32, are output through different paths. Specifically, the signal output from the memory is branched by the branch unit 65, and the branched signals are respectively output to the diagnosis controllers 31 and 32. Since the signals output to the diagnosis controllers 31 and 32 are output through different paths, even if noise occurs in the test circuit 30, the possibility of the simultaneous occurrence of errors can be reduced.

A longer branch path enables elimination of the effect of noise caused by transmission of signals in the same path. For this reason, the branch unit 65 is preferably disposed in the vicinity of the memory 33. For example, the branch unit may be disposed so that the distance from the memory to the branch unit 65 becomes shorter than the distance from the branch unit 65 to the diagnosis controllers 31 and 32.

The inversion unit 53 inverts the diagnosis control signal output from the memory 33 to the diagnosis controller 32, and outputs the inverted diagnosis control signal to the delay unit 42. The inversion unit 54 acquires the inverted diagnosis control signal from the delay unit 42, and further inverts the acquired signal to be output to the diagnosis controller 32. As described above, the diagnosis control signal is used to start or finish the comparison process of the comparison units 34 and 37. Accordingly, the provision of the inversion units 53 and 54 allows the diagnosis controllers 31 and 32 to perform different operations when an error occurs in the diagnosis control signals for the diagnosis controllers 31 and 32 simultaneously due to the effect of noise or the like. For example, one of the diagnosis controllers may start the comparison process, while the other of diagnosis controllers may not start the comparison process. In such a case, the test circuit determination unit 20 can detect a failure of the test circuit 30 based on the output results of the diagnosis controllers 31 and 32.

The error detection unit 60 detects an error of the data which is branched by the branch unit 65 and output from the memory 33 to the diagnosis controller 31 and the main controller 11. For example, the error detection is performed using an error detection code such as a parity bit. The error detection unit 60 outputs an error detection result signal indicating whether the data has an error or not to the test circuit determination unit 20 through the holding unit 58.

The error detection unit 61 detects an error of the data which is branched by the branch unit 65 and output from the memory 33 to the diagnosis controller 32. As the error detection method, a method similar to that for the error detection unit 60 is employed. The error detection unit 61 outputs an error detection result signal to the inversion unit 57 through the holding unit 59. The inversion unit 57 inverts the acquired error detection result signal and outputs the inverted signal to the test circuit determination unit 20. The test circuit determination unit 20 inverts and compares the error detection result signals output from the error detection units 60 and 61. As described above, the inversion unit 57 is used to improve the resistance to noise.

The normality determination of the test circuit 30 by using the error detection result signals in the test circuit determination unit 20 will now be described in detail. For example, when the error detection signal output from the error detection unit 60 is set to the high level, it is determined that an error is detected and a FAIL determination is made. Meanwhile, when the error detection signal is set to the low level, it is determined that no error is detected and a PASS determination is made. Further, since the error detection signal output from the error detection unit 61 is inverted by the inversion unit 57, when the error detection signal is set to the high level, a PASS determination is made. Meanwhile, when the error detection signal is set to the low level, a FAIL determination is made.

In this case, when both the outputs from the error detection units 60 and 61 are determined as PASS, the test circuit determination unit 20 determines that the test circuit 30 is normal. When both the outputs from the error detection units 60 and 61 are determined as FAIL, the test circuit determination unit 20 determines that the test circuit 30 is abnormal. Also when the output from one of the error detection units 60 and 61 is determined as FAIL, the test circuit determination unit 20 determines that the test circuit 30 is abnormal.

As described above, the test circuit determination unit 20 determines the normality of the test circuit 30 by using the determination signals output from the diagnosis controllers 31 and 32, the error detection signals output from the error detection units 60 and 61, and the comparison result signal output from the comparator 45. Thus, when at least one of the determination results indicates that the test circuit 30 is determined as abnormal, the test circuit determination unit 20 determines that the test circuit 30 is abnormal. Meanwhile, when all the determination results indicate that the test circuit 30 is determined as normal, the test circuit determination unit 20 can determine that the test circuit 30 is normal.

The buffer 62 acquires the memory control signal output from the memory control unit 36. Further, the buffer 62 outputs the acquired memory control signal to the memory 33. The buffer 63 acquires a test pattern, a diagnosis expectation value, and a diagnosis controller control signal which are output from the memory 33. The buffer 63 outputs the acquired signals and the like to the diagnosis controller 31 and the main controller 11. The buffer 64 acquires the diagnosis expectation value and the diagnosis controller control signal which are output from the memory 33. Then, the buffer 64 outputs the acquired signals and the like to the diagnosis controller 32. The use of the buffers 62 to 64 as described above prevents noise generated between the buffer 62 and the memory 33 from being transmitted between the memory control unit 36 and the buffer 62, for example.

Figure 8:
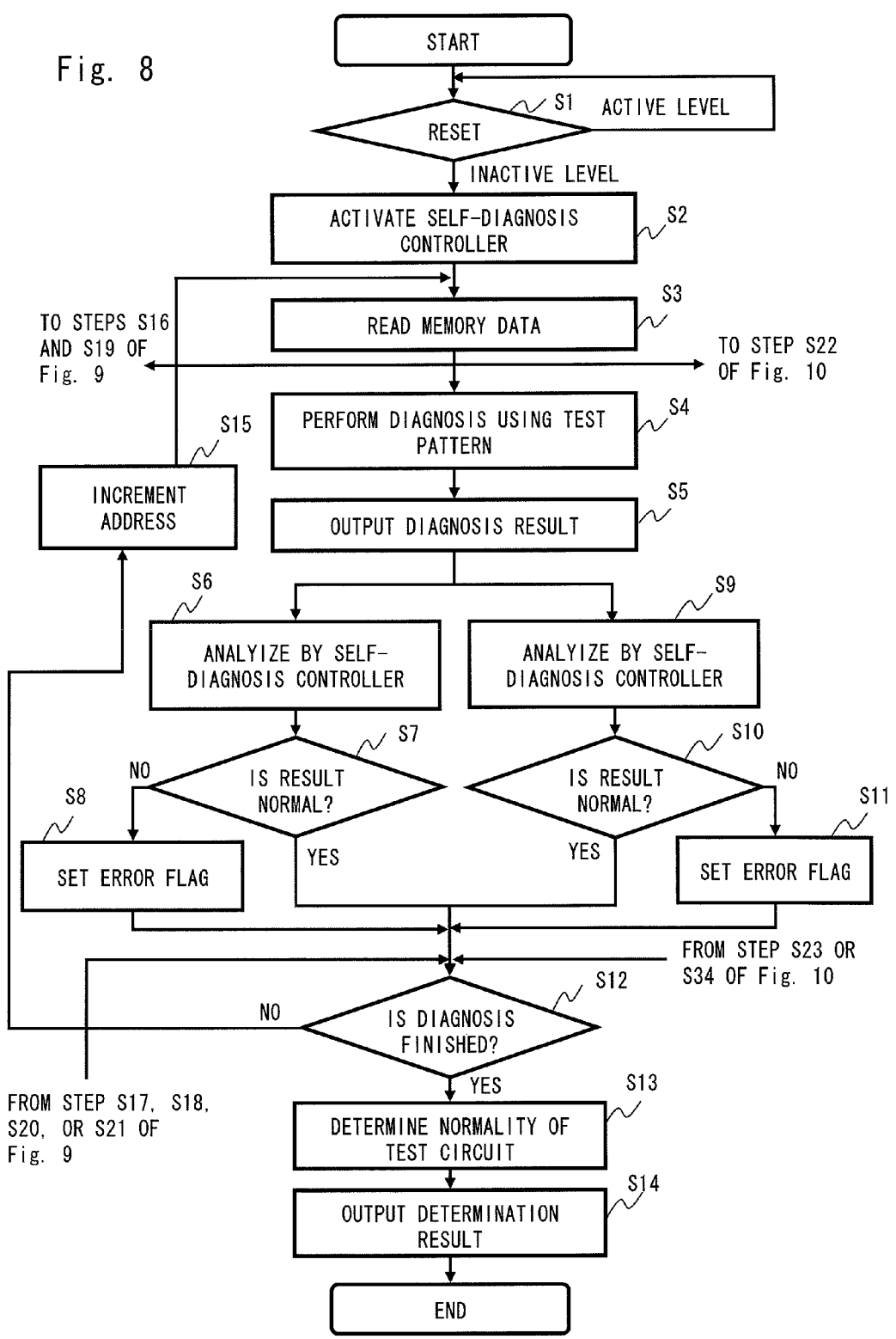
FIG. 8 is a flowchart showing processes for determining the normality of a test circuit according to the third embodiment.

Subsequently, referring to FIGS. 8 to 10, a flow of processes for determining the normality of the test target circuit 10 and the test circuit 30 according to the third embodiment of the present invention will be described. The flowchart of FIG. 8, branch processes are added after step S3 and before step S12 in the flowchart shown in FIG. 2. After step S3, the flow branches to steps S16 and S19 shown in FIG. 9, and the branches merge with the main flow before step S12. Further, after step S3, the flow branches to step S22 shown in FIG. 10, and the branch merges with the main flow before step S12. The other processes are similar to those of FIG. 2, so a detailed description thereof is omitted.

Figure 9:
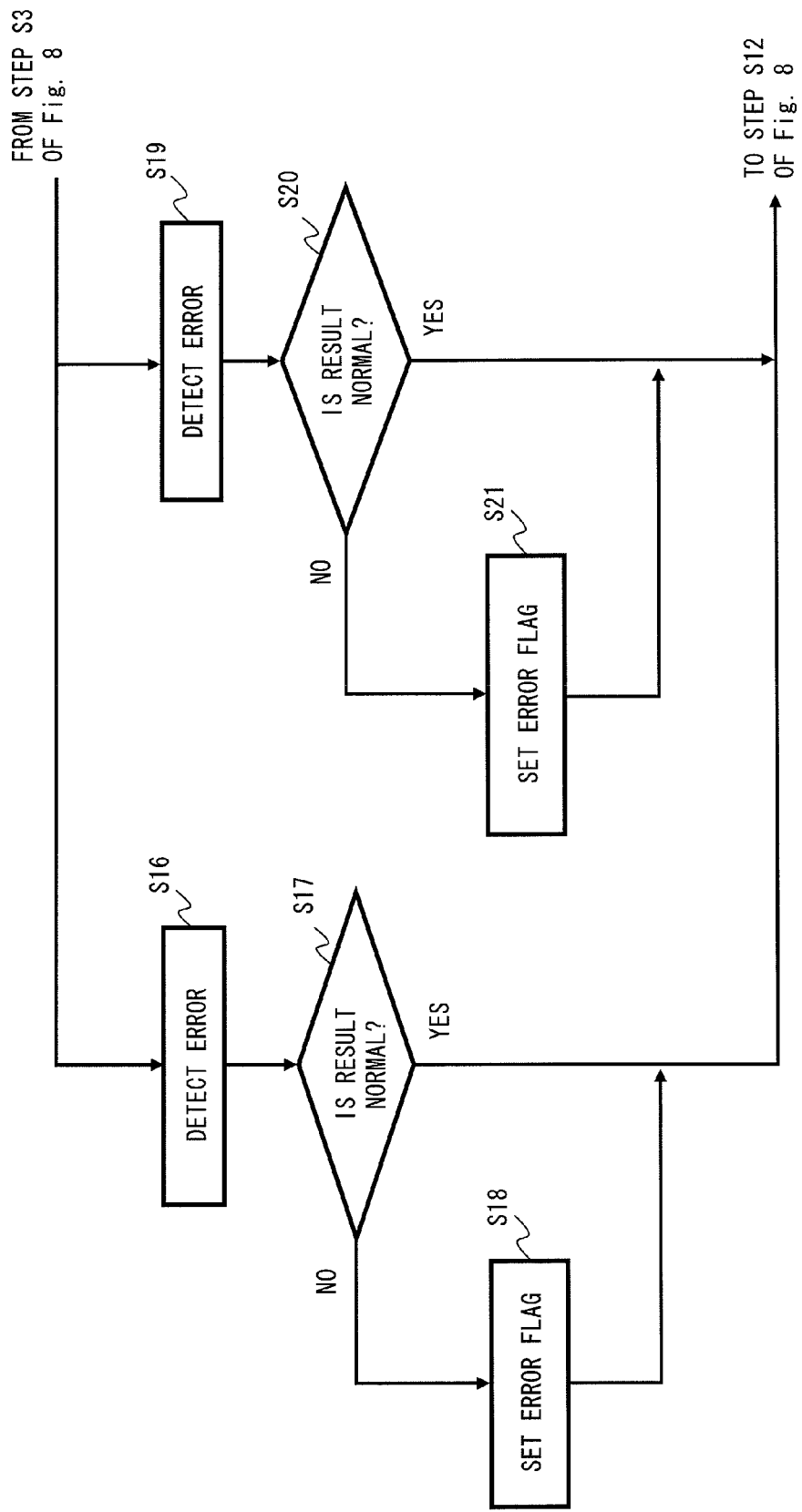
FIG. 9 is a flowchart showing processes for determining the normality of the test circuit according to the third embodiment.

Referring next to FIG. 9, a flow of processes of the error detection units 60 and 61 will be described. The error detection unit 60 performs error detection on the data read out from the memory 33 (S16). Next, the error detection unit 60 determines whether the result of the error detection is normal or not (S17). Here, when it is determined that the result of the error detection is not normal, or when an error is detected, the error detection unit 60 sets an error flag (S18). Similarly, the error detection unit 61 executes the processes of steps S19 to S21.

When the error detection process is finished in the error detection units 60 and 61, the processes after step S12 are carried out.

Figure 10:
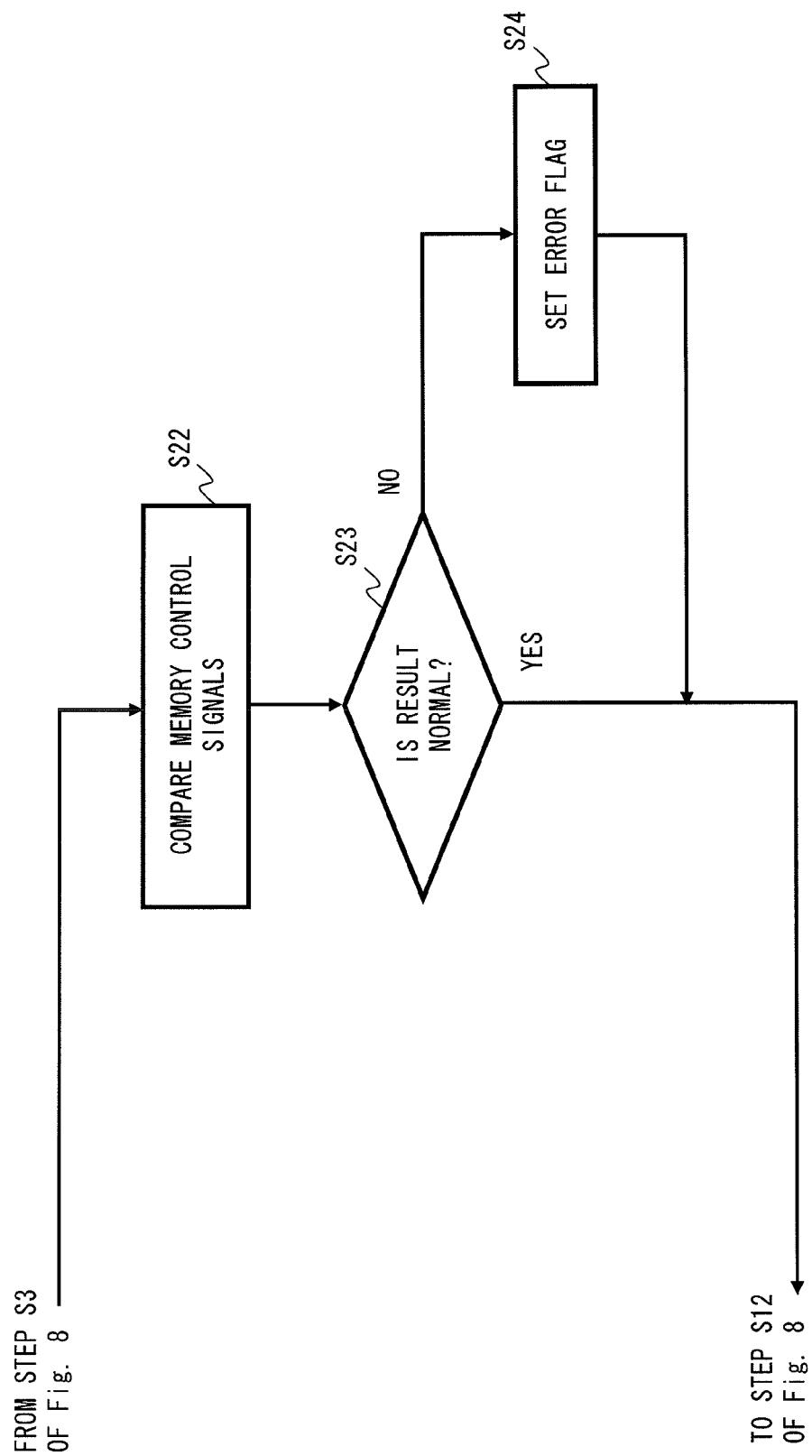
FIG. 10 is a flowchart showing processes for determining the normality of the test circuit according to the third embodiment.
Figure 11:
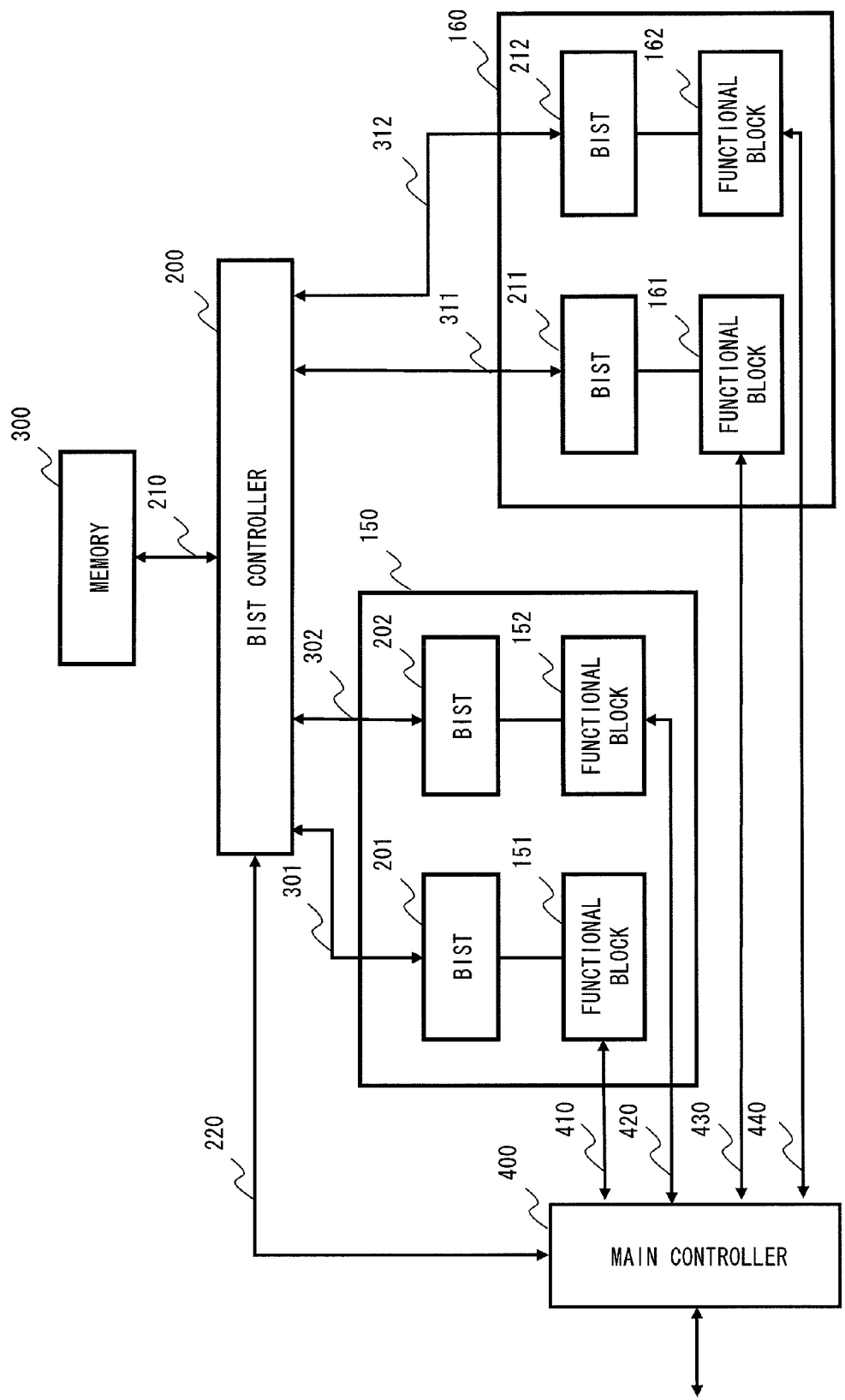
FIG. 11 is a block diagram showing a self-diagnosis device disclosed in Japanese Unexamined Patent Application Publication No. 2003-068865.

Referring next to FIG. 10, a flow of processes of the comparator 45 will be described. The comparator 45 compares the memory control signals output from the memory control units 36 and 39 (S22). The memory control signal from the memory control unit 36 is output through the inversion unit 56. Accordingly, the comparator 45 performs an inversion comparison. Then, the comparator 45 determines whether the comparison result is normal or not (S23). When the two memory control signals match, the comparator 45 determines that an abnormality occurs in one of the memory control signals, and sets an error flag (S24). When the two memory control signals do not match, the comparator 45 determines that the memory control signals are normal. When the comparison process between the memory control signals is finished in the comparator 45, the processes after step S12 are carried out.

As described above, the inversion units are provided in the self-diagnosis system according to the third embodiment of the present invention, thereby improving the resistance to noise.

Further, the data output from the memory 33 is branched in the vicinity of the memory 33 and is transmitted within the test circuit 30, thereby further improving the resistance to noise.

Furthermore, the normality of the data output from the memory 33 can be determined using the error detection units 60 and 61. This improves the reliability of the data output to the diagnosis controllers 31 and 32 and of the data output to the test target circuit 10. Consequently, the reliability of the diagnosis result of the test target circuit 10 is also improved.

Note that the present invention is not limited to the above embodiments, but can be modified as appropriate without departing from the scope of the present invention. For example, the first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A self-diagnosis system comprising:
   a test circuit including first and second diagnosis controllers which determine normality of a test target circuit by using an execution result of a test pattern in the test target circuit;
   a test circuit determination unit which determines normality of the test circuit by comparing a normality determination result of the test target circuit output from the first diagnosis controller with a normality determination result of the test target circuit output from the second diagnosis controller; and
   a first delay circuit which delays a timing for the second diagnosis controller to acquire an expectation value from a memory, with respect to a timing for the first diagnosis controller to acquire the expectation value obtained when the test pattern stored in the memory is executed, wherein the test circuit includes a memory which stores an expectation value, and the first and second diagnosis controllers include a memory control unit which controls reading the expectation value from the memory and generation of a control signal, and the first and second diagnosis controllers determine the normality of the test target circuit by comparing the execution result of a test pattern with the expectation value read out from the memory, in response to the control signal.

2. The self-diagnosis system according to claim 1, wherein the first and second diagnosis controllers determine the normality of the test target circuit by comparing the execution result of the test pattern in the test target circuit with the expectation value obtained when the test pattern stored in the memory is executed.

3. The self-diagnosis system according to claim 1, further comprising a second delay circuit which delays a timing for the second diagnosis controller to acquire the execution result of the test pattern in the test target circuit, with respect to a timing for the first diagnosis controller to acquire the execution result of the test pattern in the test target circuit.

4. The self-diagnosis system according to claim 1, further comprising:
 a first inverting circuit which inverts a signal indicating the execution result of the test pattern in the test target circuit, and outputs the inverted signal to the first diagnosis controller; and
 a second inverting circuit which further inverts the execution result of the test pattern output from the first inverting circuit.

5. The self-diagnosis system according to claim 1, further comprising a third inverting circuit which inverts the expectation value obtained when the test pattern stored in the memory is executed, and outputs the inverted expectation value to the second diagnosis controller.

6. The self-diagnosis system according to claim 2, wherein
 the memory includes a diagnosis controller control signal for controlling operation timings of the first and second diagnosis controllers, and
 the self-diagnosis system further comprises a third delay unit which delays a timing for the second diagnosis controller to acquire the diagnosis controller control signal, with respect to a timing for the first diagnosis controller to acquire the diagnosis controller control signal.

7. The self-diagnosis system according to claim 6, further comprising a fourth delay unit which delays a normality determination result output from the first diagnosis controller and outputs the delayed normality determination result to the test circuit determination unit so that the test circuit determination unit acquires the normality determination result output from the first diagnosis controller and a normality determination result output from the second diagnosis controller at the same timing.

8. The self-diagnosis system according to claim 6, further comprising:
 a fourth inverting circuit that inverts the diagnosis controller control signal output from the memory, and outputs the inverted diagnosis controller control signal; and
 a fifth inverting circuit that further inverts the diagnosis controller control signal output from the fourth inverting circuit, and outputs the inverted diagnosis controller control signal to the second diagnosis controller.

9. The self-diagnosis system according to claim 1, wherein
 each of the first and second diagnosis controllers outputs to a memory a memory control signal for reading out a test pattern, the expectation value, and the diagnosis controller control signal from the memory, the memory storing the test pattern,
 each of the first and second diagnosis controllers comprises a comparison unit which compares the memory control signals output from the first and second diagnosis controllers, and
 the test circuit determination unit determines normality of the memory control signals according to a comparison result of the comparison unit.

10. The self-diagnosis system according to claim 9, further comprising a fifth delay unit which delays the memory control signal output from the first diagnosis controller and outputs the delayed memory control signal to the comparison unit so that the comparison unit acquires the memory control signal output from the second diagnosis controller and the memory control signal output from the first diagnosis controller at the same timing.

11. The self-diagnosis system according to claim 1, further comprising a sixth inverting circuit which inverts a normality determination result output from one of the first and second self-diagnosis controllers, and outputs the inverted normality determination result to the test circuit determination unit.

12. The self-diagnosis system according to claim 9, further comprising a seventh inverting circuit which inverts the memory control signal output from one of the first and second self-diagnosis controllers, and outputs the inverted memory control signal to the comparison unit.

13. The self-diagnosis system according to claim 1, further comprising:
 a first error detection circuit which determines normality of a signal output from a memory to the first diagnosis controller, and outputs the signal to the test circuit determination unit;
 a second error detection circuit which determines normality of a signal output from the memory to the second diagnosis controller; and
 an eighth inverting circuit which inverts and outputs a signal indicating a determination result output from the second error detection circuit.

14. The self-diagnosis system according to claim 1, further comprising a branch unit which allows a signal output from a memory to branch into a path for outputting the signal to the first diagnosis controller and a path for outputting the signal to the second diagnosis controller,
 wherein the branch unit is disposed so that a distance from the branch unit to the first and second diagnosis controllers is larger than a distance from the memory to the branch unit.

15. A test circuit determination method comprising:
 determining normality of a test target circuit in first and second diagnosis controllers included in a test circuit, by using an execution result of a test pattern in the test target circuit;
 determining normality of the test circuit by comparing a normality determination result of the test target circuit output from the first diagnosis controller, with a normality determination result of the test target circuit output from the second diagnosis controller; and
 delaying a timing for the second diagnosis controller to acquire an expectation value from a memory, with respect to a timing for the first diagnosis controller to acquire the expectation value obtained when the test pattern stored in the memory is executed;

wherein the normality of the test target circuit is determined by comparing the execution result of the test pattern with an expectation value read out from a memory in response to a control signal, and the reading of the expectation value is controlled by the first and second diagnosis controllers and the control signal is generated by the first and second diagnosis controllers.

16. The self-diagnosis system according to claim 7, wherein the memory control unit includes a first memory control unit comprised by the first diagnosis controller and a second memory control unit comprised by the second diagnosis controller;

the memory stores the test pattern and the control signal;

each of the first and second memory control units outputs a memory control signal which reads the test pattern from the memory, the expectation value and the control signal to the memory; and the second memory control unit outputs the memory control signal later than the memory control signal from the first memory control unit.

\* \* \* \* \*

UNITED STATES PATENT AND TRADEMARK OFFICE
CERTIFICATE OF CORRECTION

PATENT NO. : 8,719,650 B2  
APPLICATION NO. : 13/086852  
DATED : May 6, 2014  
INVENTOR(S) : Masafumi Matsuo Page 1 of 1

It is certified that error appears in the above-identified patent and that said Letters Patent is hereby corrected as shown below:

Title Page, item (56), U.S. Patent Documents, Col. 1, Line 6: Delete "2208/0062864" and insert -- 2008/0082884 --

Title Page, item (56), U.S. Patent Documents, Col. 1, Line 6: Delete "3/2008" and insert -- 4/2008 --

Title Page, item (56), under Other Publications, Col. 2, Line 7: Delete "Jaoanese" and insert -- Japanese --

Signed and Sealed this  
Twenty-first Day of October, 2014

Michelle K. Lee  
*Deputy Director of the United States Patent and Trademark Office*